(12) United States Patent
Ausserlechner (10) Patent No.: US 11,474,166 B2
(45) Date of Patent: Oct. 18, 2022

(54) MULTI-CONTACT HALL PLATE HAVING CONTACTS EQUALLY DISTRIBUTED ALONG AN INNER EDGE REGION OF THE HALL PLATE

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 16/292,823

(22) Filed: Mar. 5, 2019

(65) Prior Publication Data

US 2019/0285707 A1    Sep. 19, 2019

(51) Int. Cl.
*G01R 33/07* (2006.01)
*H01L 43/06* (2006.01)
*G01R 33/00* (2006.01)

(52) U.S. Cl.
CPC ......... *G01R 33/07* (2013.01); *G01R 33/0029* (2013.01); *H01L 43/06* (2013.01)

(58) Field of Classification Search
CPC ..... G01R 33/0029; G01R 33/07; H01L 43/06; H01L 43/065
See application file for complete search history.

(56) References Cited

U.S. PATENT DOCUMENTS

| | | | | |
|---|---|---|---|---|
| 2,774,890 | A * | 12/1956 | Semmelman | H03C 1/48 333/24.1 |
| 4,123,772 | A * | 10/1978 | Janssen | H01L 43/065 257/427 |
| 4,668,914 | A | 5/1987 | Kersten et al. | |
| 5,548,151 | A | 8/1996 | Funaki et al. | |
| 6,008,643 | A | 12/1999 | Mani et al. | |
| 6,278,271 | B1 | 8/2001 | Schott | |
| 2002/0173941 | A1 | 11/2002 | Hines et al. | |
| 2013/0021027 | A1 | 1/2013 | Ausserlechner | |
| 2013/0342196 | A1* | 12/2013 | Ausserlechner | H01L 43/065 324/251 |
| 2015/0070002 | A1* | 3/2015 | Schott | G01D 5/145 324/207.2 |
| 2016/0041007 | A1* | 2/2016 | Lang | G01R 33/077 324/207.2 |
| 2016/0097826 | A1* | 4/2016 | Ausserlechner | G01R 33/077 324/251 |
| 2016/0252589 | A1 | 9/2016 | Raman et al. | |

(Continued)

FOREIGN PATENT DOCUMENTS

DE    2426954 A1    1/1975

OTHER PUBLICATIONS

U. Ausserlechner, "The Signal-to-Noise Ration and a Hidden Symmetry of Hall Plates", 10 pgs., Solid-State Electronics, 2017.

(Continued)

*Primary Examiner* — Jay Patidar
(74) *Attorney, Agent, or Firm* — Banner & Witcoff Ltd.

(57) ABSTRACT

A multi-contact Hall plate having four contacts or a multiple of four contacts, wherein each of the contacts is arranged substantially equally distributed along an edge region of the Hall plate, and each of the contacts is connected to one of the four terminals.

16 Claims, 10 Drawing Sheets

(56) References Cited

U.S. PATENT DOCUMENTS

2017/0345997 A1* 11/2017 Ausserlechner ........ H01L 43/04

OTHER PUBLICATIONS

W. Versnel, "Analysis Of A Circular Hall Plate With Equal Finite Contacts", 6 pgs., Solid-State Electronics, 1981.
M. G. Buehler, et al., "Magnetoconductive Correction Factors For An Isotropic Hall Plate With Point Sources", 14 pgs., Solid-State Electronics, 1966.
German Patent office, Office Action issued for DE 102018106037.8, 10 pgs., dated Oct. 16, 2018.
Office Action dated Dec. 12, 2021 issued for German Patent Application No. 102018106037.8.

* cited by examiner

MULTI-CONTACT HALL PLATE HAVING CONTACTS EQUALLY DISTRIBUTED ALONG AN INNER EDGE REGION OF THE HALL PLATE

TECHNICAL FIELD

Embodiments of the present disclosure relate to a multi-contact Hall plate and a method of operation of such device.

SUMMARY

The object is to improve existing Hall devices, in particular to mitigate the effect of offset errors.

The examples suggested herein may in particular be based on at least one of the following solutions. Combinations of the following features may be utilized to reach a desired result. The features of the method could be combined with any feature(s) of the device, apparatus or system or vice versa.

In this regard, a multi-contact Hall plate is suggested comprising: four contacts or a multiple of four contacts, wherein each contact is arranged along an edge region of the Hall plate, wherein the four contacts or the multiple of four contacts are substantially equally distributed along the edge region of the Hall plate, and wherein the four contacts or the multiple of four contacts are connected to four terminals such that one contact is connected to one of the four terminals.

A contact may be realized in various ways. A contact may be a well, which is implanted or diffused into a Hall region. The Hall region and the contacts may have the same type of charge carrier, e.g., electrons as majority charge carriers. The contact may be (in the order of, e.g., 10 to 100 times) higher doped than the Hall region. This enables a ohmic connection between the Hall region and a metallic connection. The metallic connection may be realized as a physical contact to the contact well. Ohmic contact in this regard in particular allows the current to flow in both directions across such contact, wherein potential drops substantially linearly with the current flow.

The terminals are in particular arranged to carry the supply energy to the device and to tap the output signal. Hence, two terminals are used to supply the device with electrical energy and the output signal is supplied at the other two terminals.

According to an embodiment, the edge region is an inner edge region or an outer edge region of the Hall plate.

According to an embodiment, the inner edge region and/or the outer edge region comprises a perimeter, in particular a circle line.

According to an embodiment, the four contacts or the multiple of four contacts are equally distanced along the edge region of the Hall plate.

According to an embodiment, the Hall plate is a disc.

According to an embodiment, the Hall plate is a ring structure, wherein the inside of the inner perimeter is a non-conducting area or comprises a floating contact.

According to an embodiment, the Hall plate is arranged on top or bottom of a conductive layer.

The conductive layer may be arranged such that it is a better conductor than the Hall effect region. The conductive layer may be better in this regard by a factor of at least 10 to 100. The conductive layer and the Hall plate may share an ohmic contact across their touching surfaces.

The conductive layer at the bottom (or top) of the Hall plate enables a shorting layer. The contacts embedded into the Hall plate are small in view of this shorting layer. The combination of the conductive layer, the Hall plate and the (inserted) contacts enables the overall operation of the device.

According to an embodiment, the multiple of four contacts comprises N times four contacts, N being a natural number larger than 1, the contacts $C_1, C_2, C_3, \ldots, C_{4N}$ are arranged consecutively along the edge region of the Hall plate, the four terminals T1 to T4 are connected to the contacts $C_1$ to $C_{4N}$ as follows: the terminal T1 is connected to the contacts $C_1, C_5, \ldots, C_{4N-3}$, the terminal T2 is connected to the contacts $C_2, C_6, \ldots, C_{4N-2}$, the terminal T3 is connected to the contacts $C_3, C_7, \ldots, C_{4N-1}$, and the terminal T4 is connected to the contacts $C_4, C_8, \ldots, C_{4N}$.

Also, a method is suggested for operating the device as described herein, wherein the method comprises: supplying an electrical energy to two terminals T1 and T3 of the four terminals, and tapping an output signal at the other two terminals T2 and T4, wherein the terminals T1 to T4 are connected to four of the consecutive contacts $C_1$ to $C_{4N}$.

According to an embodiment, the method further comprises: injecting a first current into the terminal T1 and extracting the first current at the terminal T3, and tapping a first voltage between the terminals T2 and T4.

According to an embodiment, the method further comprises: injecting a second current into the terminal T2 and extracting the second current at the terminal T4, and tapping a second voltage between the terminals T3 and T1.

According to an embodiment, the further comprises: injecting the first current into the terminal T3 and extracting the first current at the terminal T1, and tapping a first voltage between the terminals T4 and T2.

According to an embodiment, the method further comprises: injecting the second current into the terminal T4 and extracting the first current at the terminal T2, and tapping a first voltage between the terminals T1 and T3.

According to an embodiment, the method further comprises: adding the voltages tapped.

According to an embodiment, the method further comprises: applying a first supply voltage to the terminal T1, applying a second supply voltage to the terminal T3, and measuring a current between the terminals T2 and T4.

BRIEF DESCRIPTION OF THE DRAWINGS

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

Examples described herein relate to Hall plates, which may in particular comprise more than four contacts. Spinning schemes of such Hall plates may cancel out offset errors.

According to an exemplary embodiment, the Hall effect region (i.e. Hall plate) may comprise a circular disk or a ring structure of substantially constant thickness with 4N contacts at its perimeter. N may be any natural number larger than 1. The contacts may be distributed in a (substantially) symmetric way, i.e. the contacts may be equally large in size and the spacings between the contacts may be (substantially) equal. Moreover, the contacts may be (substantially) equally large as the spacings between adjacent contacts. Between adjacent contacts, there may be spacings or (other) isolations.

Figure 1:
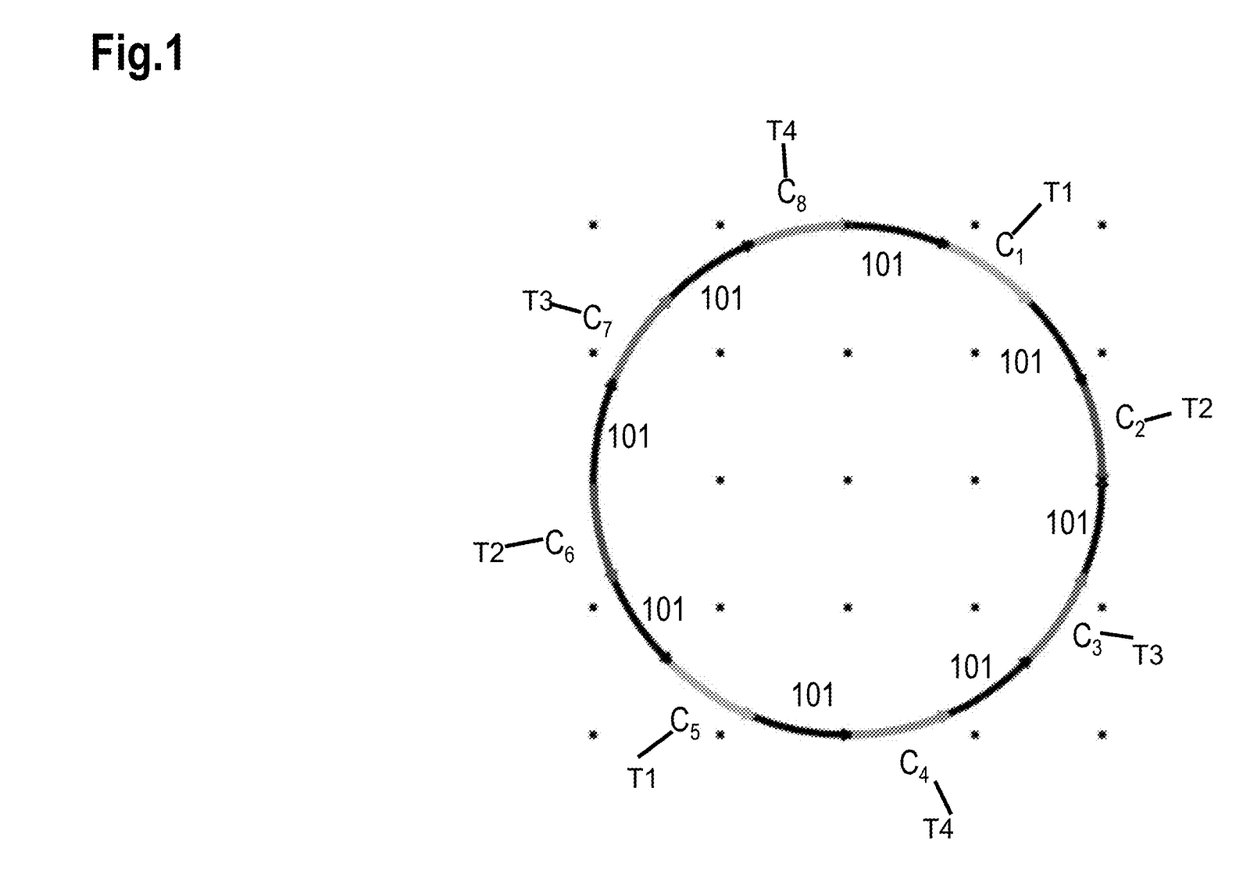
FIG. 1 shows an exemplary Hall plate with 8 contacts $C_1$ to $C_8$ and 4 terminals.

FIG. 1 shows an exemplary Hall plate with 8 contacts $C_1$ to $C_8$. This embodiment may also be referred to as 8C-HHall. Isolating boundaries 101 are arranged between the contacts $C_1$ to $C_8$.

The contact $C_1$ is connected with the contact $C_5$, the contact $C_2$ is connected with the contact $C_6$, etc. In general, the contact $C_k$ is connected with the contact $C_{k+4}$. If there are 8 contacts, each contact $C_1$ to $C_4$ is connected to one additional contact $C_5$ to $C_8$. If there are more than 8 contacts, each contact may be connected to more than one additional contact: For example, the contact $C_1$ is then connected to the contact $C_5$ and the contact $C_9$, assuming that the contacts are continuously numbered along the circle line (see also examples below). In general, the contacts may be connected together in bundles, wherein each bundle may comprise an equal number of contacts. For example, groups of two contacts or groups of three contacts may be connected together. Thus, the total number of contacts may be an integer multiple of four like 8, 12, 16, etc.

Then, the contacts C1 to C8 are connected to four terminals T1 to T4 (not shown) as follows:

the terminal T1 is connected to the contacts $C_1$ and $C_5$,
the terminal T2 is connected to the contacts $C_2$ and $C_6$,
the terminal T3 is connected to the contacts $C_3$ and $C_7$, and
the terminal T4 is connected to the contacts $C_4$ and $C_8$.

The device may then be operated as follows:

$1^{st}$ phase: A current is injected to the terminal T1 and extracted at the terminal T3; also, an output voltage between the terminals T2 and T3 is tapped.

$2^{nd}$ phase: A current is injected to the terminal T2 and extracted at the terminal T4; also, an output voltage between the terminals T3 and T1 is tapped.

$3^{rd}$ phase: This operating phase is optional: The current and the voltage tap of the $1^{st}$ phase is reversed in polarity.

$4^{th}$ phase: This operating phase is optional: The current and the voltage tap of the $2^{nd}$ phase is reversed in polarity.

$5^{th}$ phase: All voltages determined at the $1^{st}$ phase and the $2^{nd}$ phase (or at the $1^{st}$ phase, the $2^{nd}$ phase, the $3^{rd}$ phase and the $4^{th}$ phase) are added resulting in a total output voltage.

Advantageously, the total output voltage is (substantially) free of offset errors.

Figure 2:
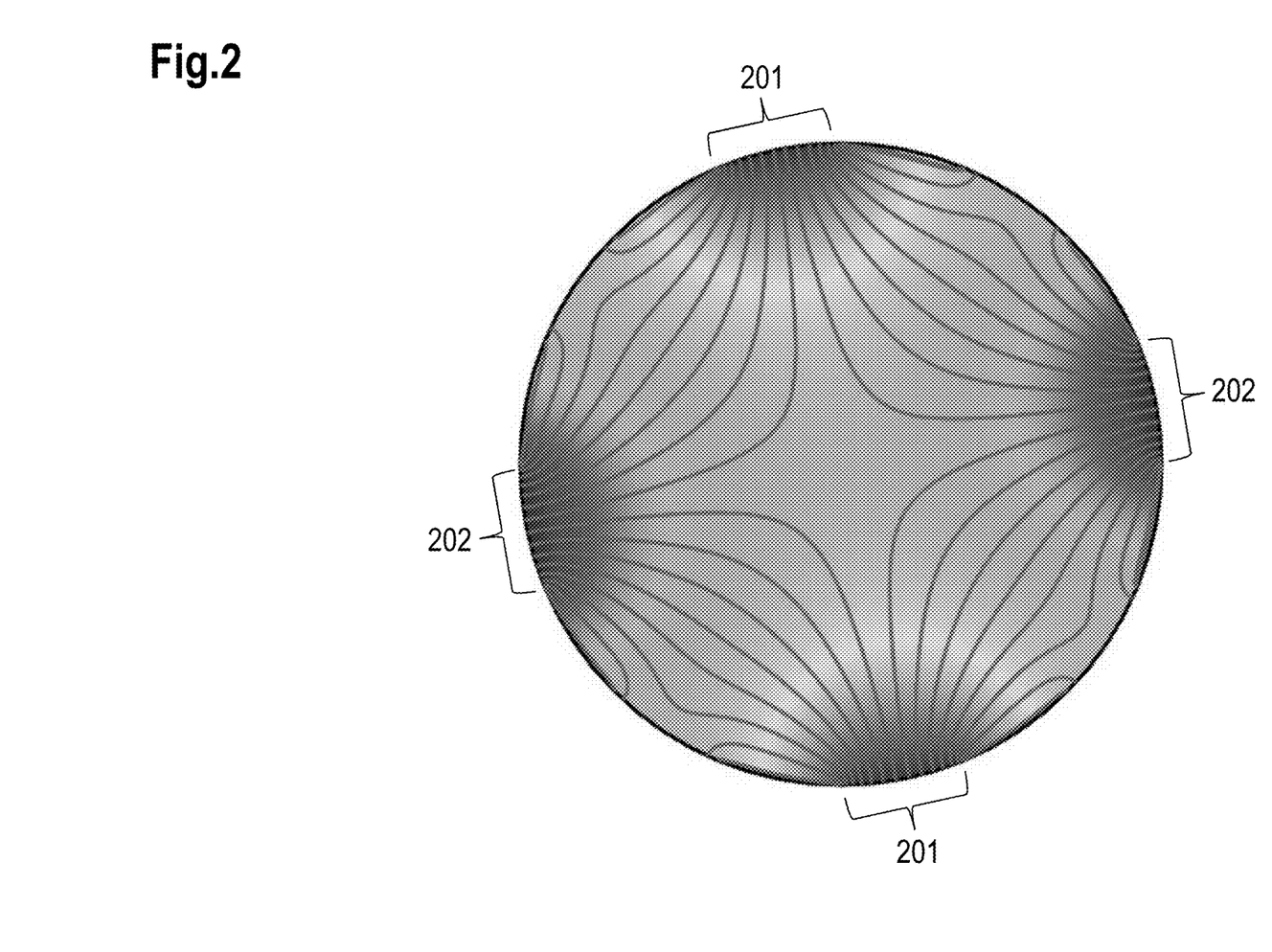
FIG. 2 shows a diagram visualizing the current density across the Hall plate of FIG. 1.

FIG. 2 shows a diagram visualizing the electric potential and the current density across the Hall plate during the $1^{st}$ phase. An area 201 shows the terminal T1 to which the current is injected and an area 202 shows the terminal T3 at which the current is extracted. This results in the current density as indicated by the various lines within the disc shown in FIG. 2. It is noted that the area 201 has a potential amounting to ca. +1V and the area 202 has a potential amounting to ca. 0V.

In the example shown in FIG. 1 and FIG. 2, each of the contacts $C_1$ to $C_8$ extends over 22.5° along the circle line (i.e. the outer edge region of the disc), also the spacings between adjacent contacts $C_1$ to $C_8$ each covers an angle of 22.5°.

In this example, a ratio of input voltage over input current and sheet resistance amounts to 0.71 squares and a ratio of output voltage over input current and sheet resistance and tangent of Hall angle amounts to 0.33, which corresponds to the Hall geometry factor.

If the Hall effect region is made of low Phosphorus doped silicon (ca. $5\times10^{15}/cm^3$) at room temperature, the voltage related magnetic sensitivity amounts to ca. 52 mV/V/T.

Figure 3:
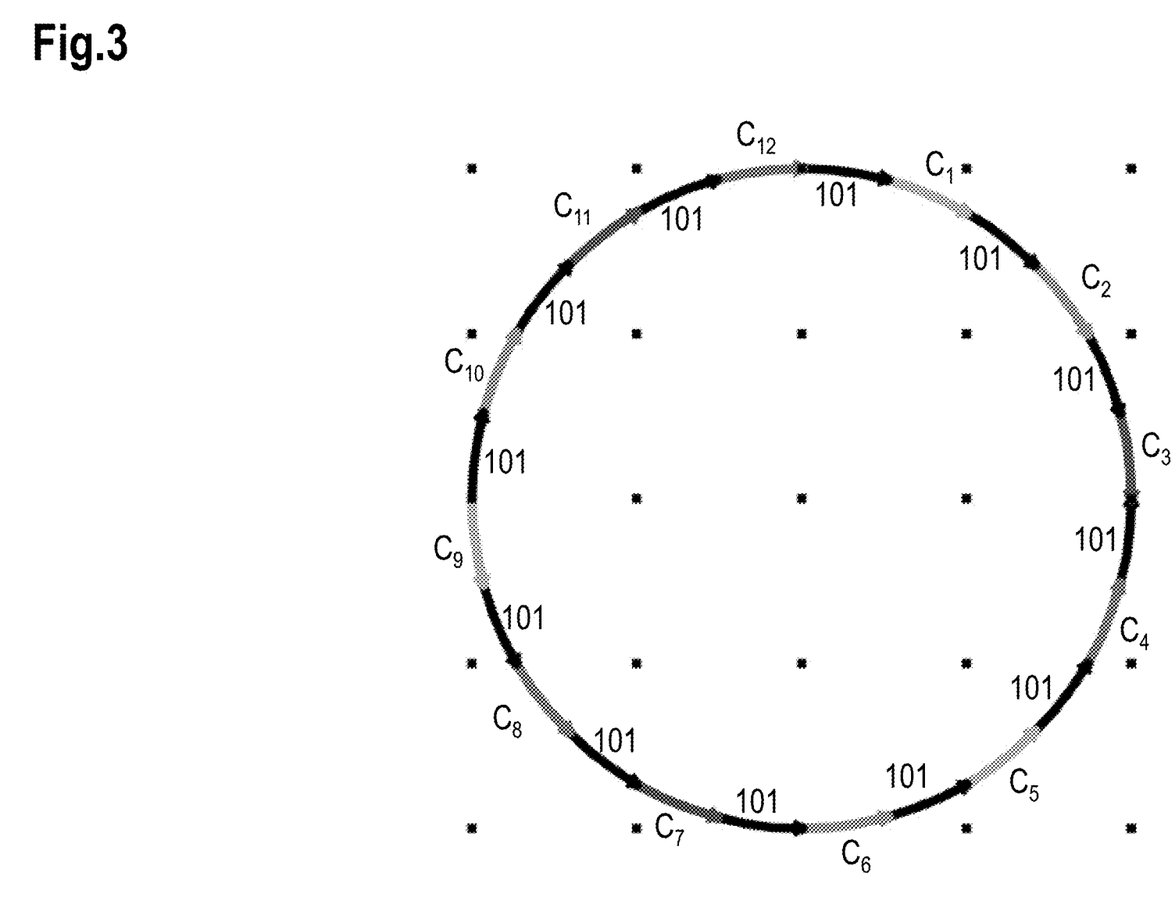
FIG. 3 shows an example of a Hall plate with 12 contacts $C_1$ to $C_{12}$ and 4 terminals.

FIG. 3 shows an example of a Hall plate with 12 contacts $C_1$ to $C_{12}$ and 4 terminals. This device is also referred to as 12C-4T-HHall. Isolating boundaries 101 are arranged between the contacts $C_1$ to $C_{12}$.

Here, the four terminals T1 to T4 are connected as follows: the terminal T1 is connected to the contacts $C_1$, $C_5$ and $C_9$, the terminal T2 is connected to the contacts $C_2$, $C_6$ and $C_{10}$, the terminal T3 is connected to the contacts $C_3$, $C_7$ and $C_{11}$, and the terminal T4 is connected to the contacts $C_4$, $C_8$ and $C_{12}$.

Each of the contacts $C_1$ to $C_{12}$ extends over 15° along the circle line, also the spacings between adjacent contacts $C_1$ to $C_{12}$ each covers an angle of 15°.

Figure 4:
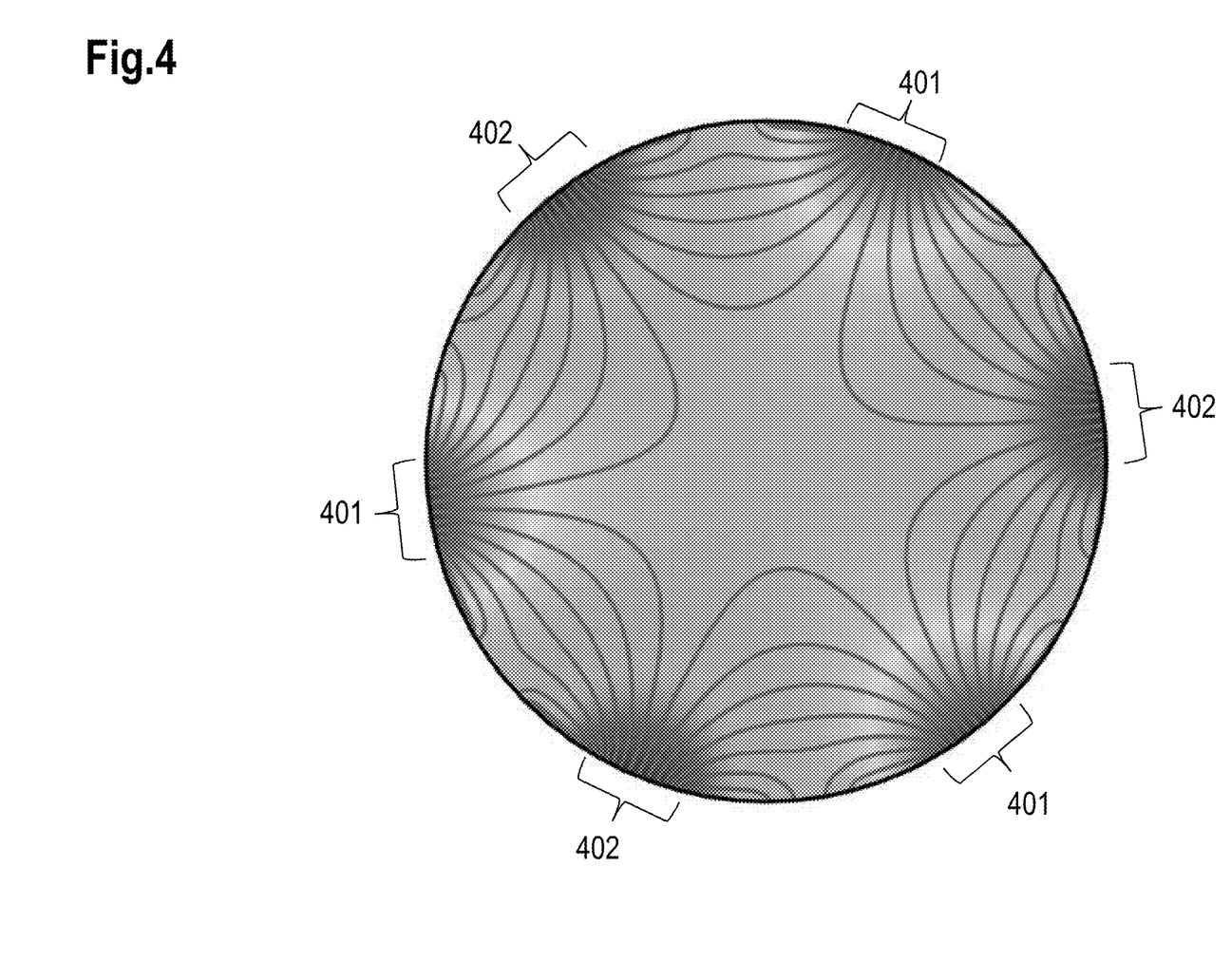
FIG. 4 shows a diagram visualizing the current density across the Hall plate of FIG. 3.

FIG. 4 shows a diagram visualizing the current density across the Hall plate during the $1^{st}$ phase. An area 401 shows the terminal T1 to which the current is injected and an area 402 shows the terminal T3 at which the current is extracted. This results in the current density as indicated by the various lines within the disc shown in FIG. 4.

FIG. 4 is indicated with 0.47 squares and a Hall geometry factor of 0.22 and a voltage related magnetic sensitivity for silicon implementation of 52 mV/V/T.

As can be seen by comparing FIG. 4 with FIG. 2, the current density becomes smaller around the center of the Hall plate when the number of contacts is increased. The increased number of contacts that extend over a smaller area along the circle line forces the current to flow near the edge.

Figure 5:
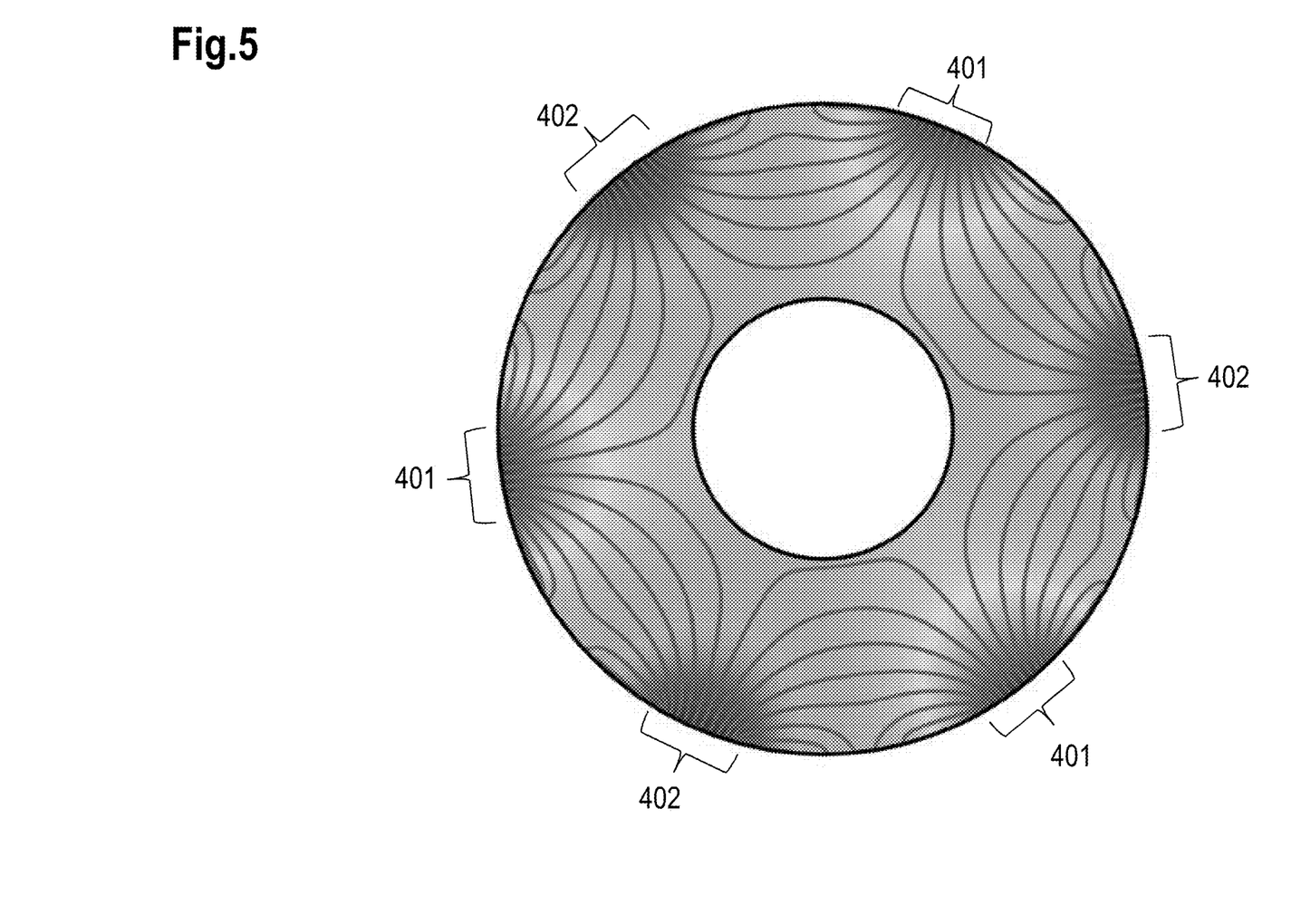
FIG. 5 shows a diagram visualizing the current density across a Hall plate that has a circular hole in the middle.

Hence, it is an option to use a Hall plate with a circular hole in the middle (which then corresponds to a ring shape). This is possible without any significant loss in magnetic sensitivity. FIG. 5 shows a diagram visualizing the current density during the $1^{st}$ phase on a hall plate with 12 contacts and 4 terminals (according to FIG. 4), which has a circular hole in the middle.

FIG. 5 applies with 0.47 squares, 0.22 Hall geometry factor, and 51 mV/V/T magnetic sensitivity.

It is also an option that the inner circle line (i.e. the inner perimeter) comprises a floating contact. Such floating contact ensures that no current flows into it or out of it. The floating contact may comprise a conductor without connection to any external potential.

Figure 6:
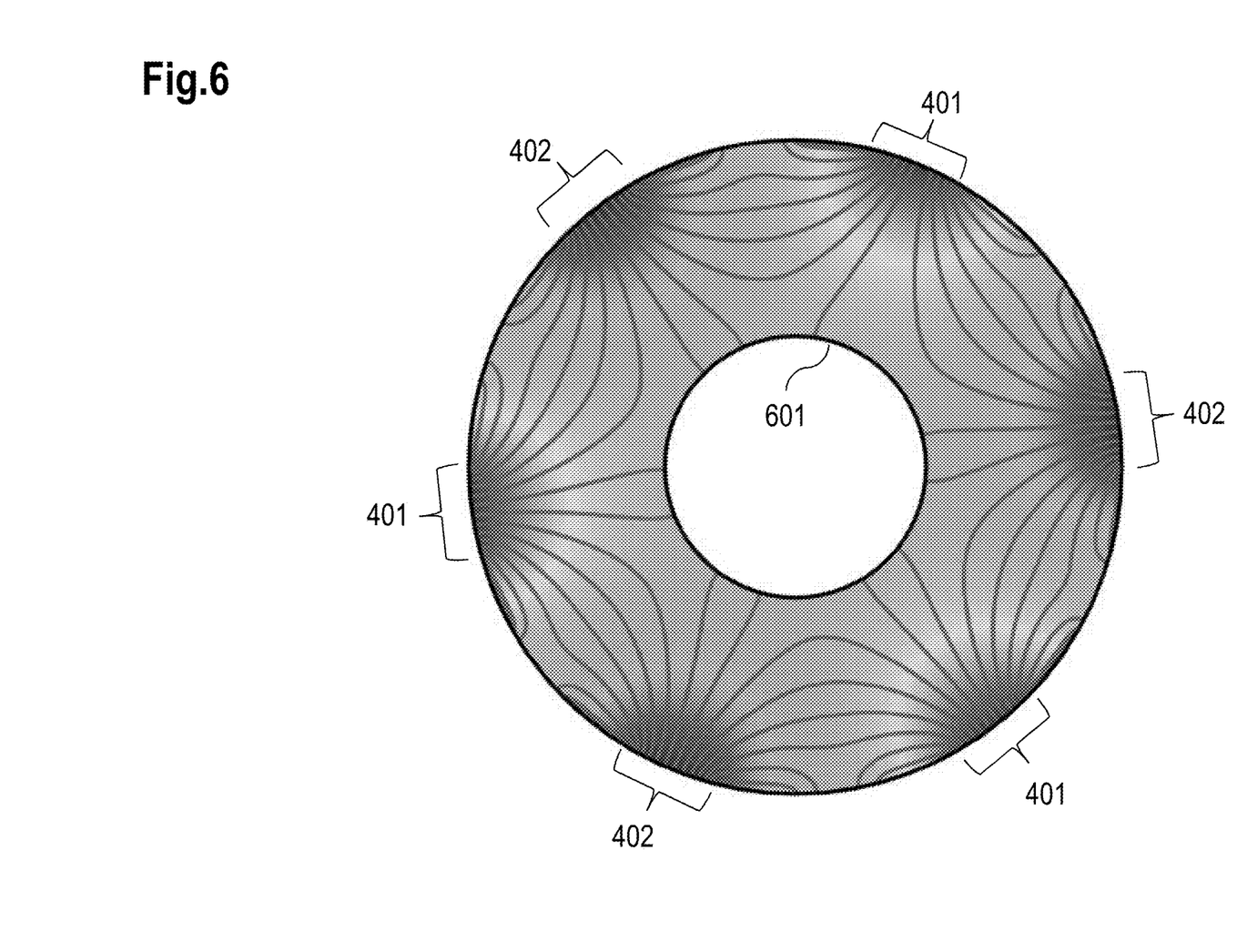
FIG. 6 shows a diagram visualizing the current density across a Hall plate according to FIG. 5, wherein the inner circular perimeter comprises a floating contact.

FIG. 6 shows a diagram of the Hall plate according to FIG. 5, wherein the inner circular perimeter comprises a floating contact 601. This allows the current to flow towards and from the floating contact 601, but no net current flows into or out of the floating contact.

FIG. 6 applies with 0.47 squares, 0.22 Hall geometry factor, and 51 mV/V/T.

Figure 7:
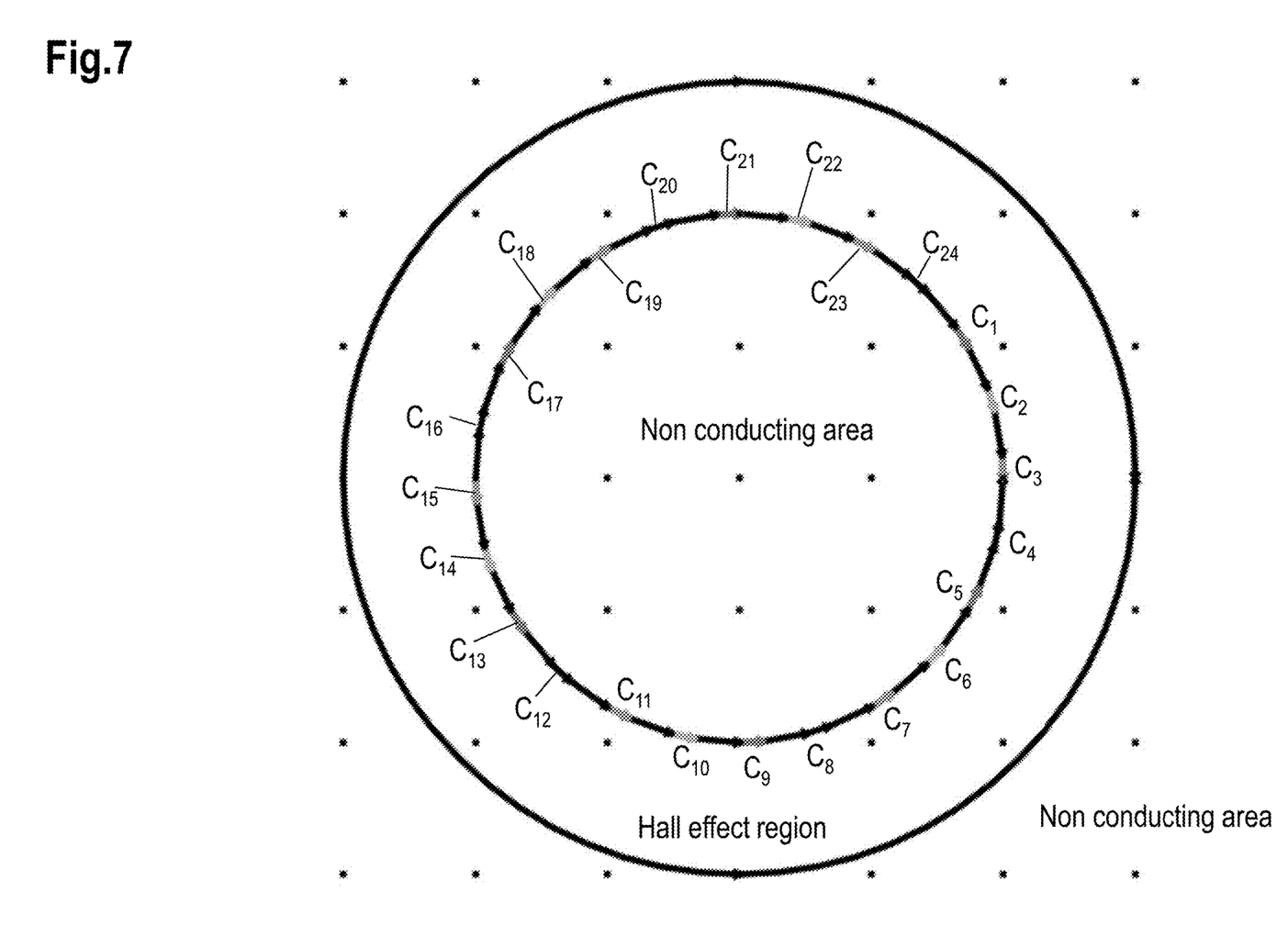
FIG. 7 shows an exemplary Hall plate with an inverted geometry comprising 24 contacts $C_1$ to $C_{24}$ and 4 terminals.

FIG. 7 shows an exemplary Hall plate with an inverted geometry. The Hall plate comprises an inner perimeter and an outer perimeter. The contacts are located on an inner perimeter. The Hall plate may have a circular hole in the middle (resulting in a ring shape) or it may comprise a non-conducting area within the inner perimeter. The outer perimeter may be a floating contact, or it may be an insulator.

FIG. 7 shows a 24C-4T-HHall, which is a device with 24 contacts $C_1$ to $C_{24}$ and four terminals T1 to T4, which are connected as follows: the terminal T1 is connected to the contacts $C_1$, $C_5$, $C_9$, $C_{13}$, $C_{17}$ and $C_{21}$, the terminal T2 is connected to the contacts $C_2$, $C_6$, $C_{10}$, $C_{14}$, $C_{18}$ and $C_{22}$, the terminal T3 is connected to the contacts $C_3$, $C_7$, $C_{11}$, $C_{15}$, $C_{19}$ and $C_{23}$, and the terminal T4 is connected to the contacts $C_4$, $C_8$, $C_{12}$, $C_{16}$, $C_{20}$ and $C_{24}$.

Figure 8:
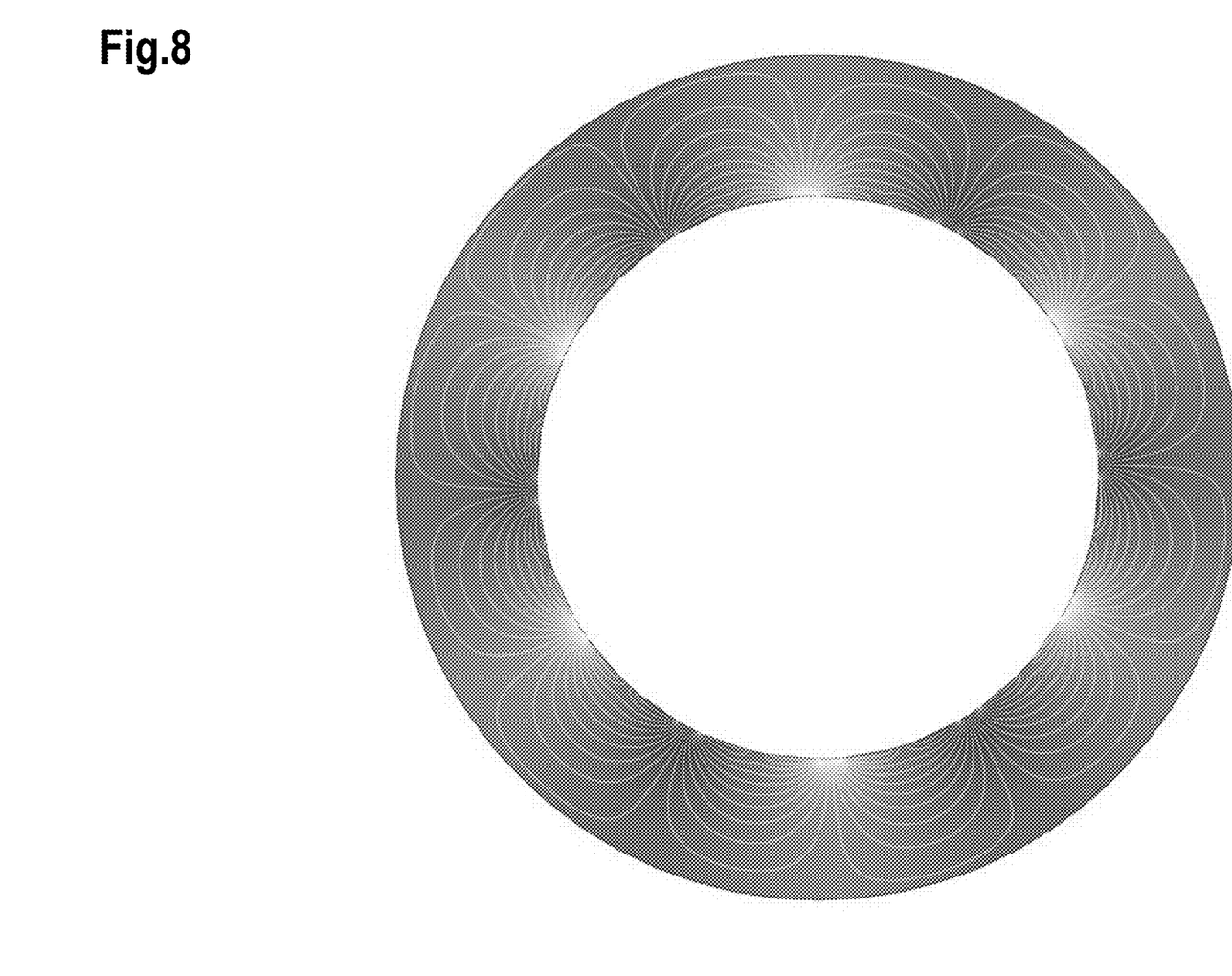
FIG. 8 shows a diagram visualizing the current density on the hall plate of FIG. 7 with a non-conducting area within the inner perimeter and an insulator at the outer perimeter.

FIG. 8 shows a diagram visualizing the current density during the $1^{st}$ phase on the hall plate shown in FIG. 7 with a non-conducting area within the inner perimeter and an insulator at the outer perimeter.

It is an option to place the contacts on the inner perimeter and the outer perimeter of a ring-shaped Hall-effect region. This may in particular be beneficial, if the contacts are small against the radial thickness of the ring, because then the set of contacts on the outer perimeter is electrically decoupled from the set of contacts on the inner perimeter.

Also, the shape of Hall plates may vary: Any geometry that is obtained by applying a conformal transformation onto the disk- and ring-shaped devices shown above may have substantially identical electrical properties, i.e. identical voltages if identical magnetic fields are applied and identical currents are injected.

The embodiments described herein advantageously allow for Hall plates with a large number of different current flow directions, which cancel out mechanical stress and thermo-electrical voltages, which otherwise would both contribute to offset errors of the devices.

It is another option to stack several devices as described herein. For example, current may flow through a first device and through a second device, whose input terminals are connected in a series connection: Hence, the current from a positive terminal of a supply circuit enters a terminal T1 of the $1^{st}$ device and exits the $1^{st}$ device at a terminal T3, wherein a terminal T2 of the $2^{nd}$ device is connected to the terminal T3 of the first device so that the same current enters the $2^{nd}$ device via its terminal T2 and exits the $2^{nd}$ device at a terminal T4. Then the voltages between the terminals T2 and T4 of the $1^{st}$ device and between the terminals T1 and T3 of the $2^{nd}$ device are at different common mode potential, but this can be handled by signal conditioning circuits.

The signal conditioning circuit may comprise two decoupled Operational-Transconductance-Amplifiers (OTAs): a first OTA detects the voltage across the terminals T2 and T4 of the $1^{st}$ device and converts this voltage into a current that is proportional to the voltage detected. This current is supplied at the output of the first OTA. A second OTA detects the voltage between the terminals T1 and T3 of the $2^{nd}$ device and converts this voltage into a current that is proportional to the voltage detected. This current is supplied at the output of the second OTA. Then, the currents at the outputs of the first OTA and the second OTA are added, which results in an addition of the two signals.

The input series connection of both devices reduces the supply voltage per device and this reduces the offset error of conventional spinning schemes (due to smaller electrical non-linearity), which further reduces the offset voltage of the solution proposed herein.

Figure 9A:
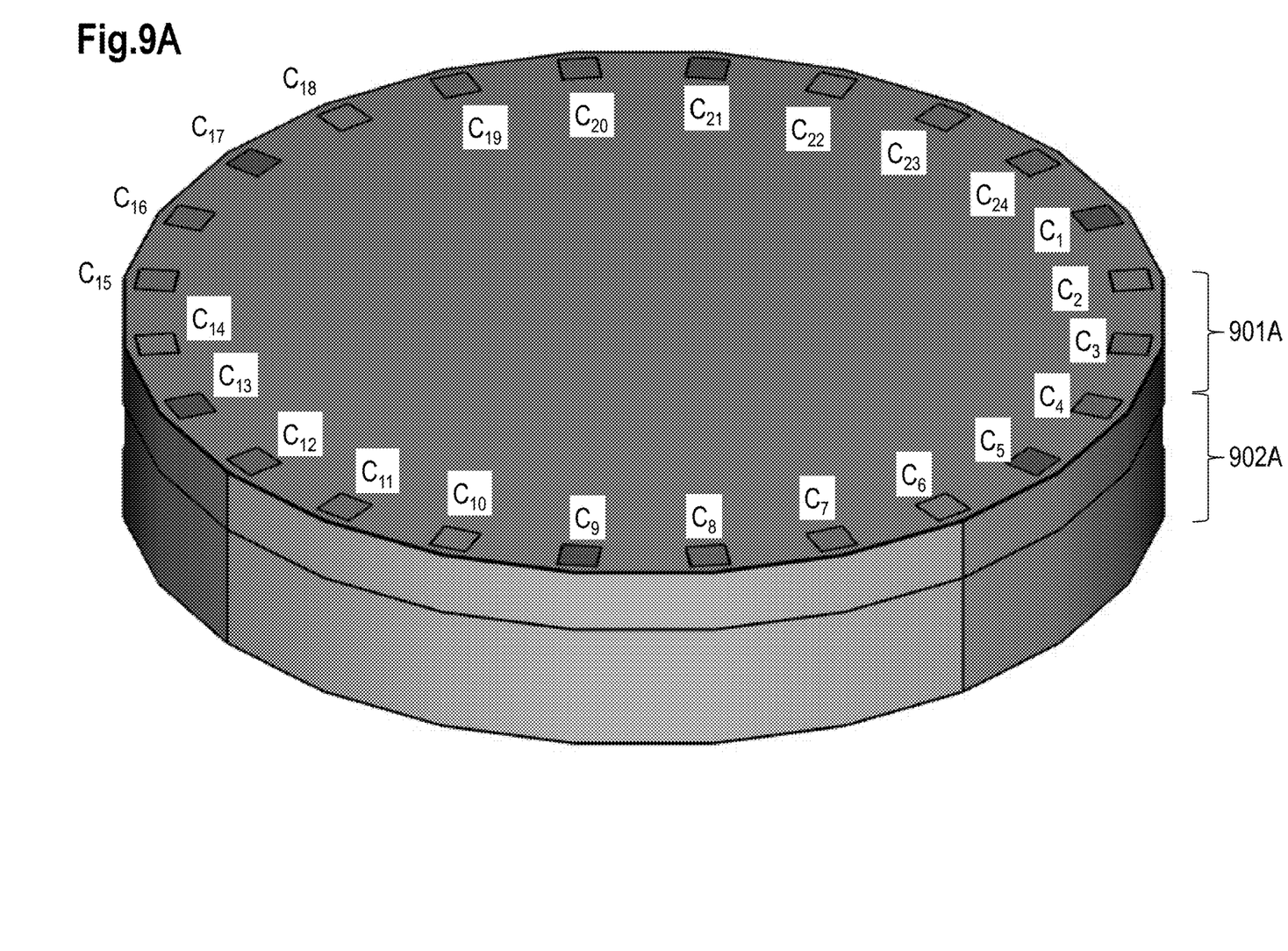
FIG. 9A shows a Hall device in an isometric view comprising a Hall plate with 24 contacts C1 to C24 and a conductive layer at the bottom of the Hall plate.

FIG. 9A shows a Hall device in an isometric view comprising a Hall plate 901A with 24 contacts C1 to C24 and a conductive layer 902A.

The conductive layer 902A may be realized as a highly conductive bottom surface at the bottom of the Hall plate 901A defining the Hall-effect region. In an exemplary embodiment, the conductive layer 902A may be an n-buried layer in contact with a lightly n-doped epitaxial layer above it, which constitutes the Hall-effect region.

Figure 9B:
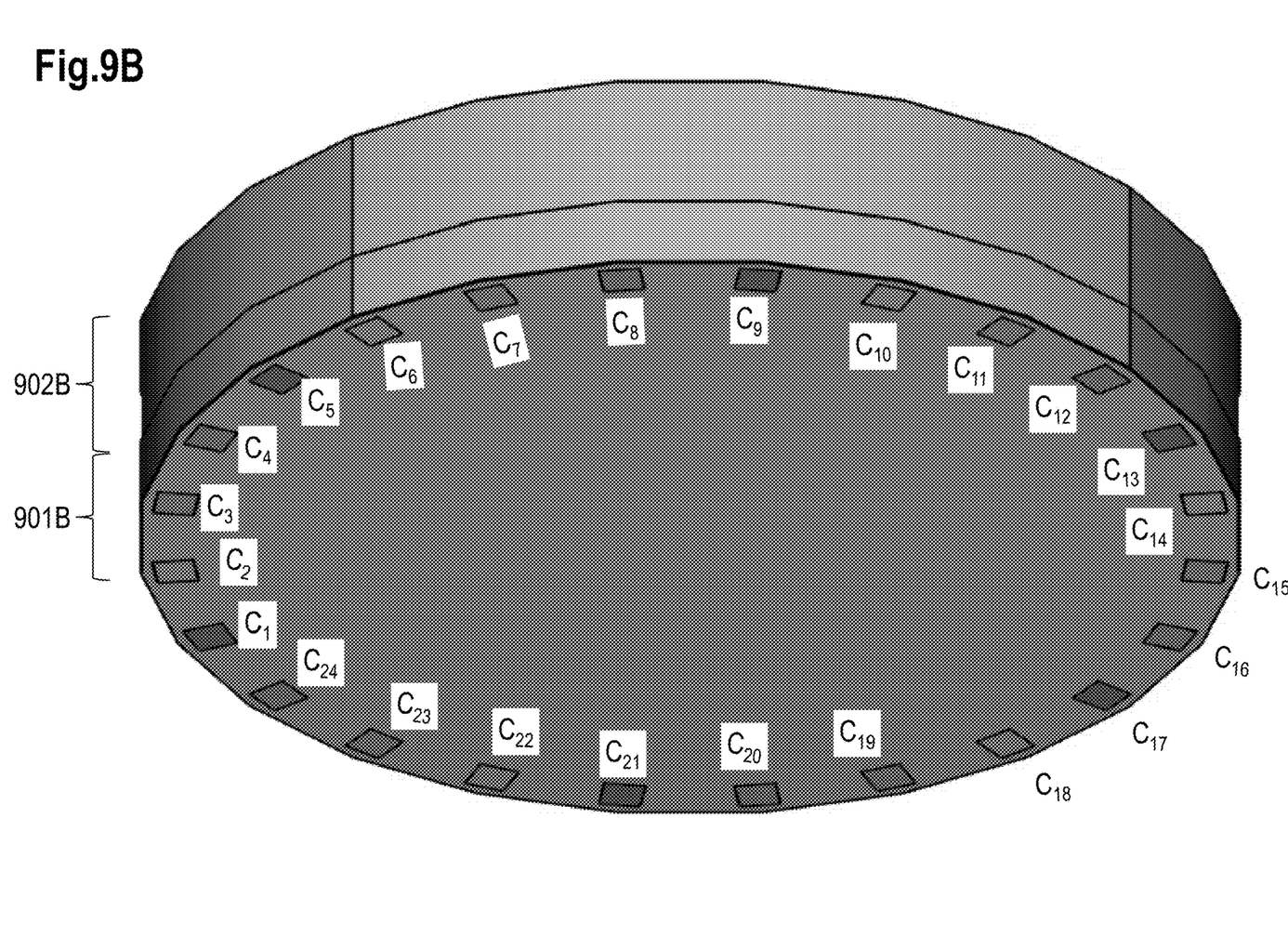
FIG. 9B shows a Hall device in an isometric view comprising a Hall plate with 24 contacts C1 to C24 and a conductive layer at the top of the Hall plate.

FIG. 9B shows a Hall device in an isometric view comprising a Hall plate 901B with 24 contacts C1 to C24 and a conductive layer 902B.

The conductive layer 902B may be realized as a highly conductive top surface at the top of the Hall plate 901B defining the Hall-effect region. In an exemplary embodiment, the conductive layer 902B may be an n-buried layer in contact with a lightly n-doped epitaxial layer above it, which constitutes the Hall-effect region.

An exemplary use case may be as follows: A circular disk may have a diameter amounting to 70 μm. The Hall effect region is 5 μm deep with a conductivity of, e.g., 65 S/m. The contacts are 3 μm×3 μm in the layout and 2 μm deep from nCMOS-well with a conductivity of, e.g., 2000 S/m. The 24 contacts are grouped as follows, wherein the contacts of each group are shorted by wires:

Group 1: C1, C5, C9, C13, C17, C21;
Group 2: C2, C6, C10, C14, C18, C22;
Group 3: C3, C7, C11, C15, C19, C23; and
Group 4: C4, C8, C12, C16, C20, C24

The shortcut by wires may be implemented in the interconnect layer of the CMOS/BiCMOS silicon technology. The wires may be made of aluminum or copper, typically having a thickness of 200 nm and a width of 2 μm.

Advantageously, the device shown in FIG. 9 provides an output signal which does not respond to magnetic field components parallel to its top surface. It only responds to magnetic fields that have a field component that is perpendicular to this top surface.

Although various exemplary embodiments have been disclosed, it will be apparent to those skilled in the art that various changes and modifications can be made which will achieve some of the advantages of the disclosure without departing from the spirit and scope of the disclosure. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the disclosure may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A multi-contact Hall plate, comprising:
    four contacts or a multiple of four contacts, wherein the Hall plate has a ring structure and each of the contacts is arranged substantially equally distributed at an inner edge region located at an inner circular perimeter defining a hole in the ring structure, no contacts are arranged at an outer edge region located at an outer circular perimeter of the ring structure, and each of the contacts is connected to one of four terminals.

2. The device according to claim 1, wherein an inside of the inner circular perimeter of the ring structure comprises a floating contact.

3. The device according to claim 1, wherein an inside of the inner circular perimeter of the ring structure is a non-conducting area.

4. The device according to claim 1, wherein the Hall plate is arranged on top of a conductive layer.

5. The device according to claim 1, wherein the Hall plate is arranged on bottom of a conductive layer.

6. The device according to claim 1,
wherein the multiple of four contacts comprises N times four contacts, N being a natural number larger than 1,
wherein the contacts are arranged consecutively along the inner edge region of the Hall plate, and
wherein the four terminals are connected to the contacts such that:
   a first of the four terminals is connected to a first of each of the multiple of four contacts,
   a second of the four terminals is connected to a second of each of the multiple of four contacts,
   a third of the four terminals is connected to a third of each of the multiple of four contacts, and
   a fourth of the four terminals is connected to a fourth of each of the multiple of four contacts.

7. A method for operating the device of claim 1, comprising:
supplying electrical energy to first and third terminals of the four terminals; and
tapping an output signal at second and fourth terminals of the four terminals,
wherein the four terminals are connected to the four contacts in consecutive order.

8. The method according to claim 7, further comprising:
injecting a first current into the first of the four terminals and extracting the first current at the third of the four terminals; and
tapping a first voltage between the second and fourth of the four terminals.

9. The method according to claim 8, further comprising:
injecting a second current into the second of the four terminals and extracting the second current at the fourth of the four terminals; and
tapping a second voltage between the third and the first of the four terminals.

10. The method according claim 9, further comprising:
adding the voltages tapped.

11. The method according to claim 9, further comprising:
injecting the first current into the third of the four terminals and extracting the first current at the first of the four terminals; and
tapping a first voltage between the fourth and the second of the four terminals.

12. The method according to claim 11, further comprising:
injecting the second current into the fourth of the four terminals and extracting the first current at the second of the four terminals; and
tapping a second voltage between the first and third of the four terminals.

13. The method according claim 12, further comprising:
adding the voltages tapped.

14. The method according to claim 7, further comprising:
applying a first supply voltage to the first of the four terminals;
applying a second supply voltage to the third of the four terminals; and
measuring a current between the second and fourth of the four terminals.

15. The method according to claim 1, wherein the outer circular perimeter of the ring structure is a floating contact.

16. The method according to claim 1, wherein the outer circular perimeter is an insulator.

\* \* \* \* \*